United States Patent
Wu

(10) Patent No.: US 10,649,292 B2
(45) Date of Patent: May 12, 2020

(54) LIQUID CRYSTAL DISPLAY PANEL AND LIQUID CRYSTAL DISPLAY DEVICE

(71) Applicant: Shenzhen China Star Optoelectronics Technology Co., Ltd., Shenzhen (CN)

(72) Inventor: Yue Wu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/907,938

(22) PCT Filed: Nov. 30, 2015

(86) PCT No.: PCT/CN2015/095898
§ 371 (c)(1),
(2) Date: Feb. 14, 2018

(87) PCT Pub. No.: WO2017/080004
PCT Pub. Date: May 18, 2017

(65) Prior Publication Data
US 2018/0157138 A1  Jun. 7, 2018

(30) Foreign Application Priority Data

Nov. 10, 2015 (CN) .......................... 2015 1 0762963

(51) Int. Cl.
| | | |
|---|---|---|
| G02F 1/1362 | (2006.01) | |
| H01L 29/06 | (2006.01) | |
| H01L 29/08 | (2006.01) | |
| G02F 1/1368 | (2006.01) | |
| H01L 29/786 | (2006.01) | |
| H01L 29/417 | (2006.01) | |
| H01L 27/12 | (2006.01) | |
| H01L 29/423 | (2006.01) | |

(52) U.S. Cl.
CPC ...... *G02F 1/136286* (2013.01); *G02F 1/1368* (2013.01); *H01L 27/12* (2013.01); *H01L 27/124* (2013.01); *H01L 29/06* (2013.01); *H01L 29/08* (2013.01); *H01L 29/41733* (2013.01); *H01L 29/42384* (2013.01); *H01L 29/786* (2013.01); *H01L 29/78696* (2013.01)

(58) Field of Classification Search
CPC . G02F 1/136286; G02F 1/1368; H01L 29/06; H01L 29/08; H01L 29/78696; H01L 29/41733; H01L 29/42384; H01L 29/786; H01L 27/124; H01L 27/12
USPC ........................................................... 349/43
See application file for complete search history.

(56) References Cited

U.S. PATENT DOCUMENTS

| | | | | |
|---|---|---|---|---|
| 5,414,283 A | * | 5/1995 | den Boer ............... | G02F 1/1368 257/59 |
| 2008/0105874 A1 | * | 5/2008 | Wang ...................... | H01L 27/12 257/59 |

* cited by examiner

*Primary Examiner* — Nathanael R Briggs
*Assistant Examiner* — William D Peterson

(57) ABSTRACT

Provided is a liquid crystal display panel and a liquid crystal display device. The liquid crystal display panel includes a substrate and a thin film transistor formed on the substrate, wherein a source and a drain of the thin film transistor have complementary V-shaped structures, so as to form a V-shaped space region between the source and the drain, such that when the thin film transistor is in operation, a V-shaped conductive channel is formed in a semiconductor layer of the thin film transistor. An activation current of the thin film transistor can be increased.

12 Claims, 4 Drawing Sheets

LIQUID CRYSTAL DISPLAY PANEL AND LIQUID CRYSTAL DISPLAY DEVICE

CROSS-REFERENCE TO RELATED APPLICATIONS

The present application claims the priority of Chinese patent application 201510762963.X, entitled "Liquid crystal display panel and liquid crystal display device" and filed on Nov. 10, 2015, the entirety of which is incorporated herein by reference.

FIELD OF THE INVENTION

The present disclosure relates to the field of liquid crystal display technologies, and in particular, to a liquid crystal display panel and a liquid crystal display device.

BACKGROUND OF THE INVENTION

In a Thin Film Transistor Liquid Crystal Display device (TFT-LCD), each pixel unit is driven by one or a plurality of TFTs integrated in the vicinity thereof, thereby realizing high-speed, high-brightness, and high-contrast display effects. Therefore, the performance of the TFT has a decisive influence on the quality of a display panel.

Generally, a TFT in the field of liquid crystal display is expected to have a relatively large activation current. That is, the voltage of the pixel unit is to be charged to a desired range in a short period of time. In a high-resolution display device, the pixel units are smaller and more intensively arranged, and each pixel has a shorter charge time when there is no variation in refresh rate thereof. Therefore, the above requirement is particularly essential in such display applications.

In the prior art, the activation current of a TFT is generally increased through increase in a width-to-length ratio of a TFT channel. For example, a U-shaped TFT can be used. However, the TFT of such a structure will increase the difficulty in a manufacturing procedure thereof, which renders it uneasy to ensure manufacture accuracy and will generate unnecessary parasitic capacitance.

SUMMARY OF THE INVENTION

In order to solve the above problem, the present disclosure provides a liquid crystal display panel and a liquid crystal display device capable of improving an activation current of a thin film transistor thereon.

According to one aspect of the present disclosure, a liquid crystal display panel is provided, comprising a substrate and a thin film transistor formed on the substrate, wherein a source and a drain of the thin film transistor are complementary V-shaped structures, so as to form a V-shaped space region between the source and the drain, such that when the thin film transistor is in operation, a V-shaped conductive channel is formed in a semiconductor layer of the thin film transistor.

According to one embodiment of the present disclosure, the semiconductor layer has a larger area than the V-shaped space region.

According to one embodiment of the present disclosure, the semiconductor layer has a V-shaped structure, which is in a same direction as the V-shaped space region and has a larger length than the V-shaped space region.

According to one embodiment of the present disclosure, a gate of the thin film transistor has a larger area than the semiconductor layer.

According to one embodiment of the present disclosure, the gate has a V-shaped structure, which is in a same direction as the V-shaped space region and has a larger length than the semiconductor layer.

According to one embodiment of the present disclosure, the liquid crystal display panel further includes data lines connected to the source and the drain, respectively, wherein each data line has a constant width the same as a width of the V-shaped space region.

According to one embodiment of the present disclosure, the liquid crystal display panel further comprises data lines respectively connected to the source and the drain, wherein each data line has a same width as the V-shaped space region at a position close to the source or the drain, and a smaller width than the V-shaped space region at a position away from the source or the drain.

According to one embodiment of the present disclosure, the liquid crystal display panel further includes a gate line connected to the gate, wherein the gate line has a constant width, which is the same as a length of the gate.

According to one embodiment of the present disclosure, the liquid crystal display panel further comprises a gate line connected to the gate, wherein the gate line has a width the same as a length of the gate at a position close to the gate, and a width smaller than the length the gate at a position away from the gate.

According to another aspect of the present disclosure, a liquid crystal display device is further provided, using the liquid crystal display panel as described above.

The present invention can increase the channel width-to-length ratio of the TFT on a limited liquid crystal display panel by means of the TFT having a V-shaped structure, thereby improving the activation current of the TFT, and enabling a smaller parasitic capacitance generated between the gate and the source and the drain.

Other features and advantages of the present disclosure will be set forth in the description which follows and, in part, will be obvious from the description, or may be learned through implementation of the present disclosure. The objectives and other advantages of the present disclosure may be realized and obtained through the structure particularly pointed out in the description, claims, and drawings.

BRIEF DESCRIPTION OF THE DRAWINGS

The drawings are provided for further understanding of the present disclosure, and constitute one part of the description. They serve to explain the present disclosure in conjunction with the embodiments, rather than to limit the present disclosure in any manner. In the drawings:

FIG. 3c schematically shows structures of a source and a drain of FIG. 3a;

FIG. 3d schematically shows the structure of a semiconductor layer in FIG. 3a;

FIG. 3e schematically shows a gate structure in FIG. 3a; and

DETAILED DESCRIPTION OF THE EMBODIMENTS

In order to render the objectives, technical features, and advantages of the present disclosure more readily understood, the present disclosure will be explained in detail with reference to the accompanying drawings.

According to the basic MOSFET formula, the current of a thin film transistor at an activation state conforms to the following formula:

$$I_{ds} = \mu_{eff} \left( \frac{\varepsilon_{int}\varepsilon_0}{t_{ins}} \right) \left( \frac{W}{L} \right) (V_{gs} - V_{th}) V_{ds}, \quad (1)$$

wherein $t_{ins}$ denotes thickness of a gate insulation layer; $\varepsilon_{int}\varepsilon_0/t_{ins}$ denotes a capacitance value of the gate insulation layer per unit area, and $\varepsilon_{int}\varepsilon_0$ denotes a dielectric constant of a gate insulation material; W/L denotes a channel width-to-length ratio; $V_{gs}$ denotes a gate-source voltage; $V_{th}$ is a threshold voltage; $V_{ds}$ is a drain-source voltage; and $\mu_{eff}$ is equivalent carrier mobility.

It can be seen from formula (1), when the TFT channel width-to-length ratio W/L is designed to be relatively large, the activation current of the TFT increases. In order to increase the width-to-length ratio of the TFT, a channel width W of the TFT can be increased on the basis of a constant TFT channel length L. However, such a design will undoubtedly increase a TFT area.

Figure 1:
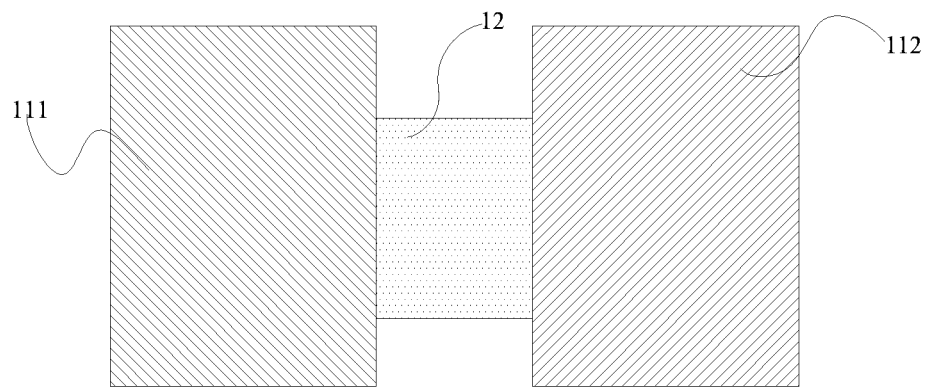
FIG. 1 schematically shows the structure of a conventional TFT in the prior art.
Figure 2:
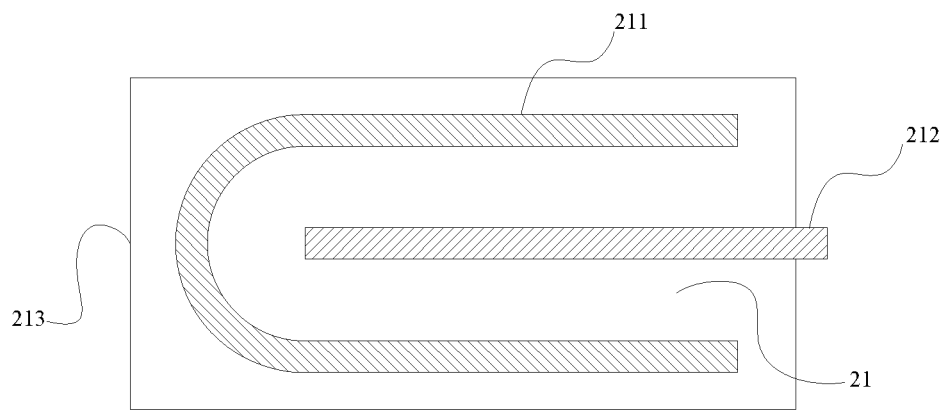
FIG. 2 schematically shows the structure of a U-shaped TFT in the prior art.

FIG. 1 schematically shows the structure of a conventional backchannel TFT. A rectangular conductive channel 12 is disposed between a source 111 and a drain 112. Such a TFT occupies a relatively large area on a liquid crystal display panel. In the prior art, a position occupied by the TFT is generally shaded by a black matrix, so that light cannot be transmitted, thus losing an aperture ratio of a pixel unit. That is, the conventional TFT design in FIG. 1 renders a light transmittable area of the liquid crystal display panel smaller, thereby deteriorating the display effect. In response of this, a U-shaped TFT is manufactured, and an arcuate conductive channel 21 formed between a source 211 and a drain 212 is as shown in FIG. 2. Compared with the conventional TFT, the U-shaped TFT can achieve a greater TFT width-to-length ratio in a smaller area, and provides an effective solution to the problem with respect to the aperture ratio.

However, the arcuate structure designed in the U-shaped TFT increases difficulty in a manufacturing procedure of the TFT (including exposure/development/etching accuracy). In the manufacturing procedure, it is a great challenge to manufacture the channel of the TFT. Because it is necessary to ensure not only separation of a gate line from a data line, but also non-excessive etching, or otherwise disconnection may be caused. In order to reduce an area of the U-shaped TFT, the data line is generally designed to be relatively thin, thus rendering it difficult to guarantee manufacturing accuracy. In addition, in the U-shaped TFT, the source 211 and the drain 212 are largely overlapped with a gate 213, which increases an unnecessary parasitic capacitance.

Therefore, the present disclosure proposes a liquid crystal display panel, using a V-shaped TFT, so as to solve the problems of a small channel width-to-length ratio of the conventional TFT, or a difficult manufacturing procedure, non-easily controllable accuracy, and generation of the parasitic capacitance of the U-shaped TFT.

Figure 3A:
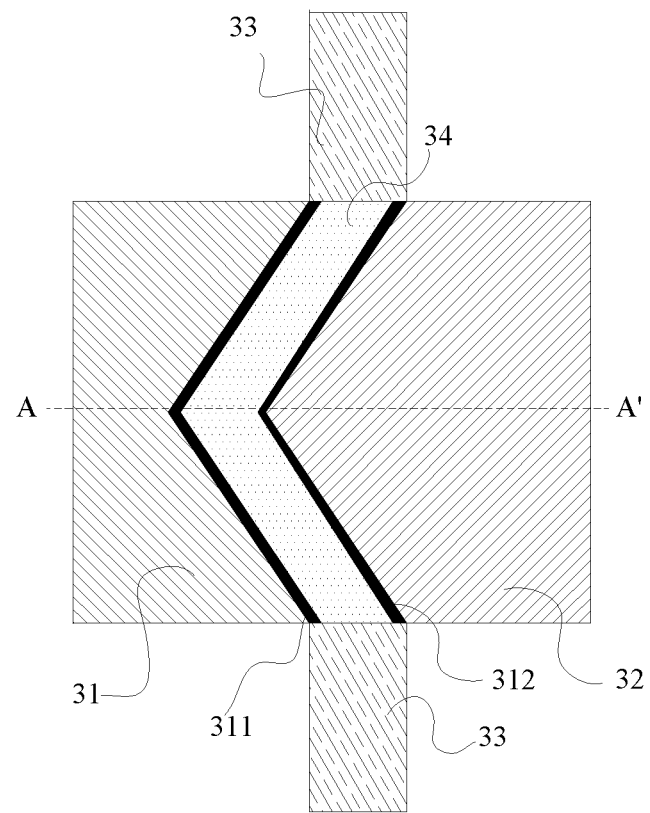
FIG. 3a schematically shows a top view of a V-shaped TFT according to one embodiment of the present disclosure.

FIG. 3a schematically shows a top view of the structure of a V-shaped TFT on a liquid crystal display panel according to one embodiment of the present disclosure. The present disclosure will be described in detail with reference to FIG. 3a in the following.

A source 31 and a drain 32 of the thin film transistor are of complementary V-shaped structures, so as to form a V-shaped space region therebetween, such that when the thin film transistor is in operation, a V-shaped conductive channel can be formed in a semiconductor layer 34 of the thin film transistor. FIG. 3c schematically shows structures of the source 31 and the drain 32 of the thin film transistor, wherein the source 31 has a concave V-shaped structure, and the drain 32 has a convex V-shaped structure. The concave V-shaped structure and the convex V-shaped structure are complementary to each other, and a V-shaped space region 321 is formed therebetween, as shown in an elliptical region in FIG. 3c. While the thin film transistor is in operation, the V-shaped conductive channel corresponding to the V-shaped space region 321 is formed in the semiconductor layer 34.

Figure 3B:
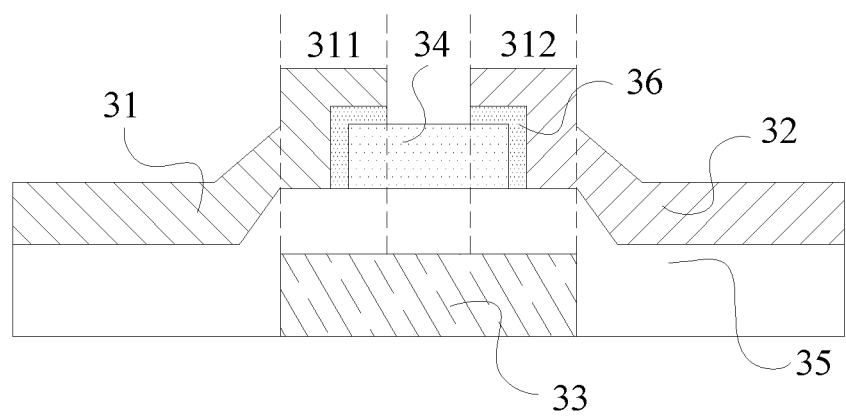
FIG. 3b schematically shows a cross-section view of FIG. 3a along line A-A'.
Figure 3C:
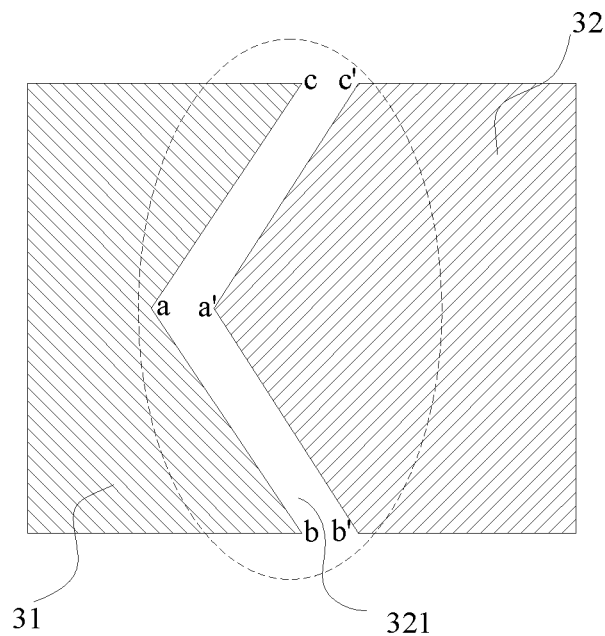

FIG. 3b schematically shows a cross-section view of FIG. 3a along line A-A'. As shown in FIG. 3b, the thin film transistor is formed on a substrate (not shown), wherein the thin film transistor includes a gate 33 formed on the substrate, a gate insulation layer 35 formed on the gate 33, the semiconductor layer 34 formed on the gate insulation layer 35, and the source 31 and the drain 32 that are formed on the semiconductor layer 34. In general, an ohmic contact layer 36 is provided between the semiconductor layer 34 and the source and the drain in order to reduce contact resistance between the semiconductor layer 34 and the source and the drain formed thereon.

As shown in FIGS. 3a and 3b, while the thin film transistor is in operation, a current flows from the source 31 to the drain 32 via the semiconductor layer 34, wherein the current flows through two straight-line edges ab and ac of the V-shape of the source 31 into the semiconductor layer 34 as the current flows from the source 31 into the semiconductor layer 34. In this way, entire edges of the V-shape of the source 31 are regarded as a width of a current flow passage, and a distance from the source 31 to the drain 32 of the V-shaped space region 321 is regarded as a length of the current flow passage. When flowing from the semiconductor layer 34 to the drain 32, the current enters the drain 32 through two straight-line edges a'b' and a'c' of a V-shape of the drain 32.

Compared with the rectangular conductive channel 12 of FIG. 1, the conductive channel of the present disclosure, without any changes in length or height, has an increased width-to-length ratio, as the edges of the V-shaped source 31 and that of the V-shaped drain 32 increase the width of the current flow passage, thereby improving the activation current. Therefore, compared with the conventional TFT in FIG. 1, the TFT of the present disclosure has an increased activation current based on a same area.

In addition, compared with the arcuate conductive channel 21 in the U-shaped TFT as shown in FIG. 2, the V-shaped conductive channel of the present disclosure has straight-line edges ab, ac, a'b', and a'c'. This lowers the manufacturing difficulty of the TFT. Meanwhile, in the present disclosure, it is unnecessary to overlap much of the source and the drain with the gate. As a result, it is unnecessary to reduce the area of the TFT through attenuation of the source and the drain and the data line connected thereto, thereby avoiding an accuracy problem of the source and the drain, and the data line in the manufacturing procedure.

In one embodiment of the present disclosure, the semiconductor layer 34 has a larger area than the V-shaped space region 321 formed between the source 31 and the drain 32 of the thin film transistor. This is because the source 31 and the drain 32 are formed on two sides of the semiconductor layer 34 of the thin film transistor, and the source 31 and the drain 32 are partially overlapped with the semiconductor layer 34, respectively. As a result, the source 31 and the drain 32 are respectively connected to the semiconductor layer 34, as shown in FIG. 3b. The area of the semiconductor layer 34 is larger than the area of the V-shaped space region 321 between the source 31 and the drain 32 of the thin film transistor, so that the source 31, the drain 32, and the V-shaped conductive channel corresponding to the V-shaped space region 321 between the source 31 and the drain electrode 32 can be formed on the semiconductor layer 34.

Figure 3D:
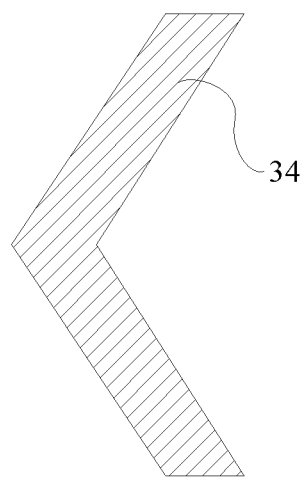

In one embodiment of the present disclosure, the semiconductor layer 4 has a V-shaped structure, and the V-shaped structure of the semiconductor layer 34 is in a same direction as the V-shaped space region 321 and longer than the V-shaped space region 321. For convenient expression, it is defined that the V-shaped space region 321 has a length along a left-right direction thereof and a width along an upper-lower direction thereof. This is also the case for the semiconductor layer 34 and the gate 33. FIG. 3d shows the V-shaped semiconductor layer 34. When the thin film transistor is manufactured, the V-shaped semiconductor layer 34 has a same direction as the V-shaped space region 321, thus reducing an area of the thin film transistor. In addition, when the semiconductor layer 34 has a structure shown in FIG. 3d, the length of the semiconductor layer 34 from left to right is required to be larger than the length of the V-shaped space region 321 from left to right (i.e., length of the current flow passage during operation of the thin film transistor), so as to enable the semiconductor layer 34 to be in contact with the source 31 and the drain 32 on the two sides thereof.

In one embodiment of the present disclosure, the gate 33 of the thin film transistor has a larger area than the semiconductor layer 34. Such an arrangement facilitates the formation of the conductive channel with sufficient width on the semiconductor layer 34 when the thin film transistor is in operation, thereby connecting the source 31 and the drain 32.

Figure 3E:
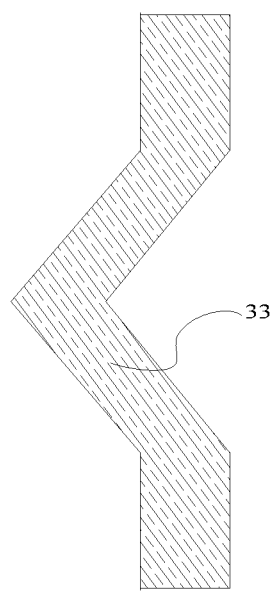

In one embodiment of the present disclosure, the gate 33 of the thin film transistor is in a V-shaped structure, which has a same direction as the V-shaped space region 321 and is longer than the semiconductor layer 34. FIG. 3e shows a V-shaped gate 33, which is advantageous for formation of a V-shaped conductive channel in the semiconductor layer 34 as compared with a rectangular gate 33 or a gate 33 in other shapes. Moreover, the area of the gate 33 can thus be reduced also. In addition, when the gate 33 has a structure as shown in FIG. 3e, a length of the gate 33 from left to the right is configured to be greater than the length of the semiconductor layer 34 from left to right, thereby facilitating formation of the conductive channel with a sufficient width on the semiconductor layer 34, and further, the source 31 and the drain 32 can be connected to each other.

As shown in FIGS. 3a and 3b, the source 31 and the drain 32 are both partially overlapped with the gate 33, wherein an overlapping portion 311 of the source 31 and the gate 33 and an overlapping portion 312 of the drain 32 and the gate 33 generate parasitic capacitance. In FIG. 2, overlapping portions of the source 211 and the drain 212 with the gate 213 of the U-shaped TFT also generate parasitic capacitance. As can be seen from FIGS. 3a and 2, overlapping portions of the source and the drain with the gate of FIG. 2 are larger, and thus larger parasitic capacitance is generated thereby; and overlapping portions of the source and the drain with the gate of FIG. 3a is smaller, and thus smaller parasitic capacitance is generated thereby.

In one embodiment of the present disclosure, the liquid crystal display panel further includes data lines connected to the source 31 and the drain 32, respectively, wherein each data line has a constant width, which is the same as that of the V-shaped space region 312 from top to bottom. That is, the width of the data line is equal to width of a V-shaped edge of the V-shaped space region 312 from top to bottom. This is also the case for the drain 32. Such a design does not require variation in the width of the data line, and is favorable for achievement of a manufacturing procedure.

In one embodiment of the present disclosure, the liquid crystal display panel further includes a gate line connected to the gate 33, wherein the gate line has a constant width, which is the same as length of the V-shaped space region 312 from left to right.

Figure 4:
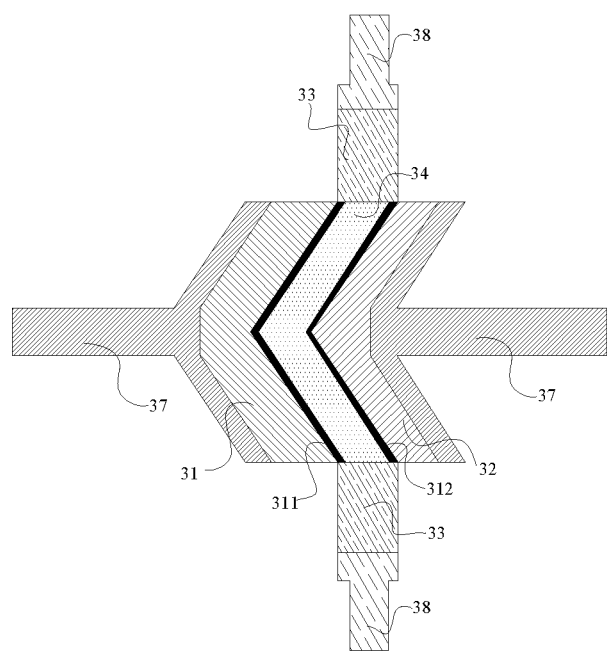
FIG. 4 schematically shows a top view of the structure of a V-shaped TFT according to another embodiment of the present disclosure.

In one embodiment of the present disclosure, the liquid crystal display panel further includes data lines 37 connected to the source 31 and the drain 32, respectively, wherein each data line 37 has a width the same as the width of the space region 312 at a position adjacent to the source 31 or the drain 32, and a width smaller than the width of the space region 312 at a position away from the source 31 or the drain 32. As shown in FIG. 4, when the data line 37 is close to the source 31 or the drain 32, the width of the data line 37 is equal to the width of the V-shaped space region 321 from top to bottom, and when the data line 37 is away from the source 31 or the drain 32, the width of the data line 37 is smaller than the width of the V-shaped space region 321 from top to bottom. Such a design can reduce an area of the data line 37 on the liquid crystal display panel, which contributes to increase in the aperture ratio.

In one embodiment of the present disclosure, the liquid crystal display panel further includes a gate line 38 connected to the gate 33, wherein the gate line 38 has a width the same as the length of the gate electrode 33 at a position adjacent to the gate 33, and a width smaller than the length of the gate electrode 33 at a position away from the gate 33. As shown in FIG. 4, the width of the gate line 38 is the same as the length of the gate 33 from left to right at a position adjacent to the gate 33, and smaller than the length of the gate 33 from left to right at a position away from the gate 33. Such a design can reduce an area of the gate line 38 on the liquid crystal display panel, which contributes to increase in the aperture ratio.

According to another aspect of the present disclosure, a liquid crystal display device is further provided, using the above-described liquid crystal display panel. The liquid crystal display panel uses the V-shaped thin film transistor, so as to increase a channel width-to-length ratio of a device in a limited area. This helps to increase an activation current, and can also result in a smaller parasitic capacitance between the gate line and the data line.

In manufacture of the liquid crystal display panel described above, the following steps are mainly included.

At the outset, a first layer of metal is deposited on a substrate, and gate and gate line patterns are formed after treatment performed thereon. Specifically, a gate metal layer with a certain thickness is formed on the substrate by sputtering. A positive photoresist is coated on the metal layer, and a corresponding mask is used for exposure. This is followed by development, wet etching, and photoresist stripping, to obtain the gate and gate line patterns. It should be noted that the gate pattern formed in this step has a V-shaped structure.

Next, an insulation material is deposited on the gate, and a gate insulation layer is formed by a chemical vapor deposition (CVD) film forming procedure.

Afterwards, a layer of semiconductor material is deposited on the gate insulation layer, and a semiconductor layer pattern is formed after treatment performed thereon. Specifically, the layer of semiconductor material is deposited on the gate insulation layer first, and the semiconductor layer pattern is formed by photoresist coating, exposure, development, wet etching, photoresist stripping, etc. Sometimes, in order to reduce a contact barrier between the semiconductor layer and the source and the drain formed thereafter, it is also necessary to form a layer of doped amorphous silicon film as a modifying layer on the semiconductor material layer, which precedes photoresist coating, exposure, development, wet etching, photoresist stripping, and the like performed on the semiconductor material layer and the modifying layer. It is to be noted that the semiconductor layer pattern formed here also has a V-shaped structure.

Subsequently, a second layer of metal is deposited on the semiconductor layer, and the source, the drain, and the data line of the thin film transistor are formed through treatment performed thereon, wherein the source and the drain of the thin film transistor are complementary V-shaped structures.

Finally, a protective layer is formed on the TFT. In an actual manufacturing operation of the panel, a potential of the data line is introduced by means of a metal or oxide wire through perforation of a via hole in the protective layer.

Although the embodiments of the present disclosure have been described above, the description is merely for the purpose of facilitating the understanding of the present disclosure and is not intended to limit the present disclosure. It should be understood by those skilled in the art that various changes in form and details may be made therein without departing from the spirit and scope of the present disclosure. It is intended that the scope of the present disclosure should be determined within the scope of the claims appended hereto.

The invention claimed is:

1. A liquid crystal display panel, comprising a substrate and a thin film transistor formed on the substrate, wherein a source and a drain of the thin film transistor have complementary V-shaped structures, so as to form a V-shaped space region between the source and the drain; such that when the thin film transistor is in operation, a V-shaped conductive channel is formed in a semiconductor layer of the thin film transistor; wherein, the V-shaped structure of the source is concave, and the V-shaped structure of the drain is convex;
   wherein, the semiconductor layer has a larger area than the V-shaped space region;
   wherein, the semiconductor layer has a V-shaped structure, which is in a same direction as the V-shaped space region and has a larger length than the V-shaped space region;
   wherein, a gate of the thin film transistor has a larger area than the semiconductor layer;
   wherein, the gate has a V-shaped structure, which is in a same direction as the V-shaped space region and has a larger length than the semiconductor layer.

2. The liquid crystal display panel according to claim 1, wherein the liquid crystal display panel further includes data lines connected to the source and the drain, respectively, and
   wherein each data line has a constant width the same as a width of the V-shaped space region.

3. The liquid crystal display panel according to claim 1, wherein the liquid crystal display panel further comprises data lines connected to the source and the drain respectively, and
   wherein each data line has a same width as the V-shaped space region at a position close to the source or the drain, and a smaller width than the V-shaped space region at a position away from the source or the drain.

4. The liquid crystal display panel according to claim 1, wherein the liquid crystal display panel further includes a gate line connected to the gate, and
   wherein the gate line has a constant width which is the same as a length of the gate.

5. The liquid crystal display panel according to claim 1, wherein the liquid crystal display panel further comprises a gate line connected to the gate, and
   wherein the gate line has a width the same as a length of the gate at a position close to the gate, and a width smaller than the length the gate at a position away from the gate.

6. A liquid crystal display device, comprising a liquid crystal display panel, which includes a substrate and a thin film transistor formed on the substrate, wherein a source and a drain of the thin film transistor are complementary V-shaped structures, so as to form a V-shaped space region between the source and the drain, such that when the thin film transistor is in operation, a V-shaped conductive channel is formed in a semiconductor layer of the thin film transistor; wherein, the V-shaped structure of the source is concave, and the V-shaped structure of the drain is convex;
   wherein the semiconductor layer has a larger area than the V-shaped space region;
   wherein the semiconductor layer has a V-shaped structure, which is in a same direction as the V-shaped space region and has a larger length than the V-shaped space region;
   wherein a gate of the thin film transistor has a larger area than the semiconductor layer;
   wherein the gate has a V-shaped structure, which is in a same direction as the V-shaped space region and has a larger length than the semiconductor layer.

7. The liquid crystal display device according to claim 6, wherein the liquid crystal display panel further includes data lines connected to the source and the drain, respectively, and
   wherein each data line has a constant width the same as a width of the V-shaped space region.

8. The liquid crystal display device according to claim 6, wherein the liquid crystal display panel further comprises data lines respectively connected to the source and the drain, and
   wherein each data line has a same width as the V-shaped space region at a position close to the source or the drain, and a smaller width than the V-shaped space region at a position away from the source or the drain.

9. The liquid crystal display device according to claim 6, wherein the liquid crystal display panel further includes a gate line connected to the gate, and
   wherein the gate line has a constant width, which is the same as a length of the gate.

10. The liquid crystal display device according to claim 6, wherein the liquid crystal display panel further comprises a gate line connected to the gate, and
   wherein the gate line has a width the same as a length of the gate at a position close to the gate, and a width smaller than the length the gate at a position away from the gate.

11. The liquid crystal display panel according to claim 1, wherein, each of the V-shaped structure of the source and the V-shaped structure of the drain has two straight-line edges, such that the V-shaped conductive channel has four straight-line edges.

12. The liquid crystal display panel according to claim 11, wherein, the V-shaped structure of the source has two straight-line edges extending straight from two ends of the V-shaped structure of the source to a bottom of the V-shaped structure of the source respectively, and the V-shaped structure of the drain has two straight-line edges extending straight from two ends of the V-shaped structure of the drain to a top of the V-shaped structure of the drain respectively.

* * * * *